United States Patent
Dai et al.

(10) Patent No.: US 12,198,609 B2
(45) Date of Patent: Jan. 14, 2025

(54) DISPLAY PANEL AND DISPLAY DEVICE INCLUDING VIRTUAL HOLES

(71) Applicant: Xiamen Tianma Display Technology Co., Ltd., Xiamen (CN)

(72) Inventors: Jiaxiang Dai, Xiamen (CN); Ping An, Xiamen (CN)

(73) Assignee: Xiamen Tianma Display Technology Co., Ltd., Xiamen (CN)

( * ) Notice: Subject to any disclaimer, the term of this patent is extended or adjusted under 35 U.S.C. 154(b) by 19 days.

(21) Appl. No.: 18/103,700

(22) Filed: Jan. 31, 2023

(65) Prior Publication Data

US 2023/0178007 A1      Jun. 8, 2023

(30) Foreign Application Priority Data

Aug. 5, 2022   (CN) .......................... 202210938431.7

(51) Int. Cl.
  *G09G 3/32*       (2016.01)
  *G09G 3/3225*    (2016.01)
(52) U.S. Cl.
  CPC ............. *G09G 3/32* (2013.01); *G09G 3/3225* (2013.01); *G09G 2310/0286* (2013.01)
(58) Field of Classification Search
  None
  See application file for complete search history.

(56) References Cited

U.S. PATENT DOCUMENTS

| 2021/0057457 | A1* | 2/2021 | Kim  | H10K 59/1213 |
| 2021/0104588 | A1* | 4/2021 | Han  | H01L 29/786 |
| 2022/0020783 | A1* | 1/2022 | Zhao | H01L 27/124 |
| 2022/0158129 | A1* | 5/2022 | Kim  | H10K 59/40 |
| 2024/0224773 | A1* | 7/2024 | Chan | H10K 59/131 |

* cited by examiner

*Primary Examiner* — Benjamin C Lee
*Assistant Examiner* — Emily J Frank
(74) *Attorney, Agent, or Firm* — KDW Firm PLLC

(57) ABSTRACT

Provided are a display panel and a display device. The display panel includes a first region and a second region, a first driver circuit, a first driver circuit, a function component, a function hole and a virtual hole. The first region includes a pixel unit. The first driver circuit is located in the second region and includes a first drive signal output terminal, where the first drive signal output terminal is configured to provide a first drive signal for the pixel unit in the first region. The function component includes a first function layer, a second function layer and a preset dielectric layer located between the first function layer and the second function layer. The function hole penetrates through the preset dielectric layer and is configured to connect the first function layer to the second function layer. The virtual hole penetrates through the preset dielectric layer.

19 Claims, 8 Drawing Sheets

DISPLAY PANEL AND DISPLAY DEVICE INCLUDING VIRTUAL HOLES

CROSS-REFERENCE TO RELATED APPLICATION(S)

This application claims priority to Chinese Patent Application No. 202210938431.7 filed Aug. 5, 2022, the disclosure of which is incorporated herein by reference in its entirety.

TECHNICAL FIELD

The present disclosure relates to the field of display technology, and in particular to, a display panel and a display device.

BACKGROUND

In a display panel, a transistor is an indispensable element and is used for realizing functions of display, touch control and the like of the display panel.

The transistor includes an active layer, the active layer contains hydrogen, and the stability of the transistor may be affected by hydrogen in the active layer. Therefore, in a manufacturing process of the display panel, the active layer is usually subjected to a hydrogen relief treatment.

However, a hydrogen relief effect of the active layer in the transistor in an existing display panel is poor, whereby the stability of the transistor is affected, and further the display effect is affected.

SUMMARY

The present disclosure provides a display panel and a display device, so as to solve a problem that an active layer in a transistor in an existing display panel is poor in the hydrogen relief effect.

According to an aspect of the present disclosure, a display panel is provided. The display panel includes a first region and a second region, a first driver circuit, a first driver circuit, a function component, a function hole and virtual holes. The first region includes a pixel unit. The first driver circuit is located in the second region and includes a first drive signal output terminal, where the first drive signal output terminal is configured to provide a first drive signal for the pixel unit in the first region. The function component includes a first function layer, a second function layer and a preset dielectric layer located between the first function layer and the second function layer. The function hole penetrates through the preset dielectric layer and is configured to connect the first function layer to the second function layer. The virtual hole penetrates through the preset dielectric layer and is not configured to connect the first function layer to the second function layer, where at least one virtual hole of the virtual holes is located in the second region and located on a side of the first drive signal output terminal facing away from the first region.

According to another aspect of the present disclosure, a display device is provided. The display device includes the display panel described above.

BRIEF DESCRIPTION OF DRAWINGS

In order to more clearly explain the technical schemes in embodiments of the present disclosure, the drawings used for describing the embodiments will be briefly introduced below. Obviously, the drawings in the following description are merely some embodiments of the present disclosure. For those of ordinary skill in the art, other drawings may also be obtained without creative labor according to these drawings.

DETAILED DESCRIPTION

In order to make those skilled in the art better understand the schemes of the present disclosure, the technical schemes in the embodiments of the present disclosure will be clearly and completely described below in conjunction with the drawings in the embodiments of the present disclosure, and it is obvious that the described embodiments are merely a part of the embodiments of the present disclosure, and not all of the embodiments. All other embodiments, which may be obtained by those of ordinary skill in the art without making any creative effort based on the embodiments of the present disclosure, shall fall within the scope of protection of the present disclosure.

It should be noted that the terms "first", "second" and the like in the description and claims and above drawings of the present disclosure are used for distinguishing between similar objects and not necessarily for describing a particular sequence or sequential order. It should be appreciated that data so used may be interchanged where appropriate so that the embodiments of the present disclosure described herein may be practiced in other sequences than those illustrated or described herein. Furthermore, the terms "include" and "have" and any variations thereof are intended to cover a non-exclusive inclusion, such as a process, a method, a system, an article, or an apparatus that contains a list of steps or units, and are not necessarily limited to those steps or units expressly listed, but may include other steps or units not expressly listed or inherent to such process, method, article, or apparatus.

Figure 1:
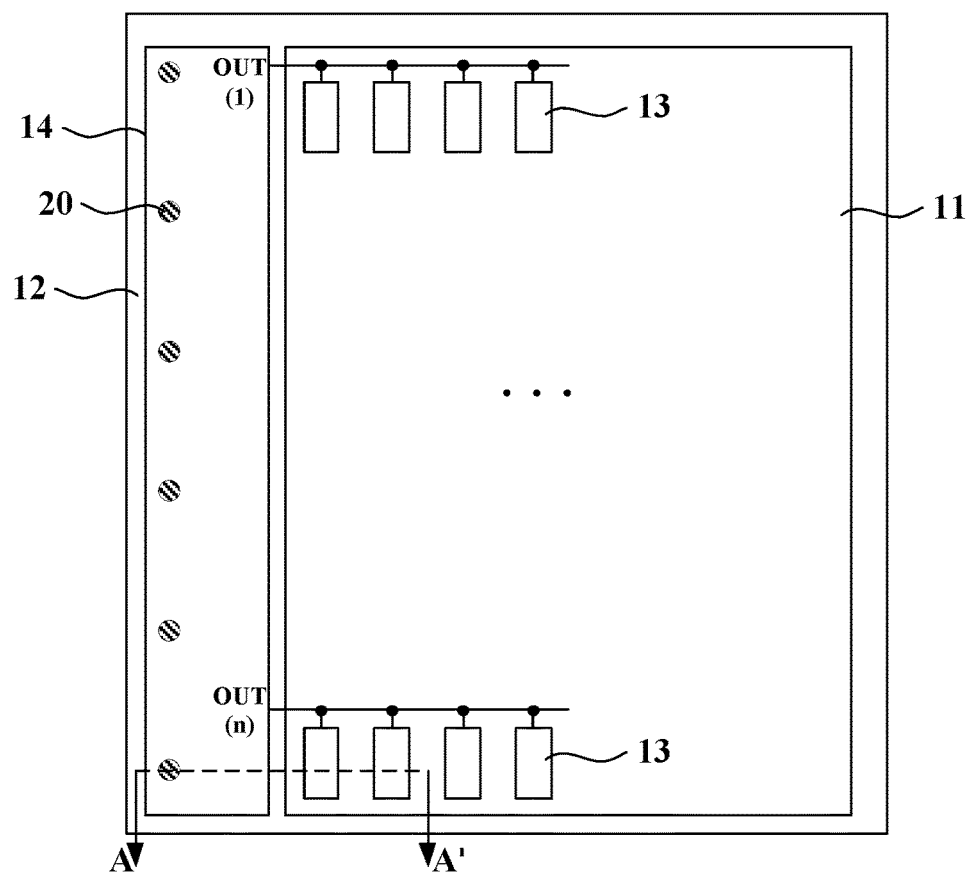
FIG. 1 is a schematic diagram of a display panel provided in an embodiment of the present disclosure.
Figure 2:
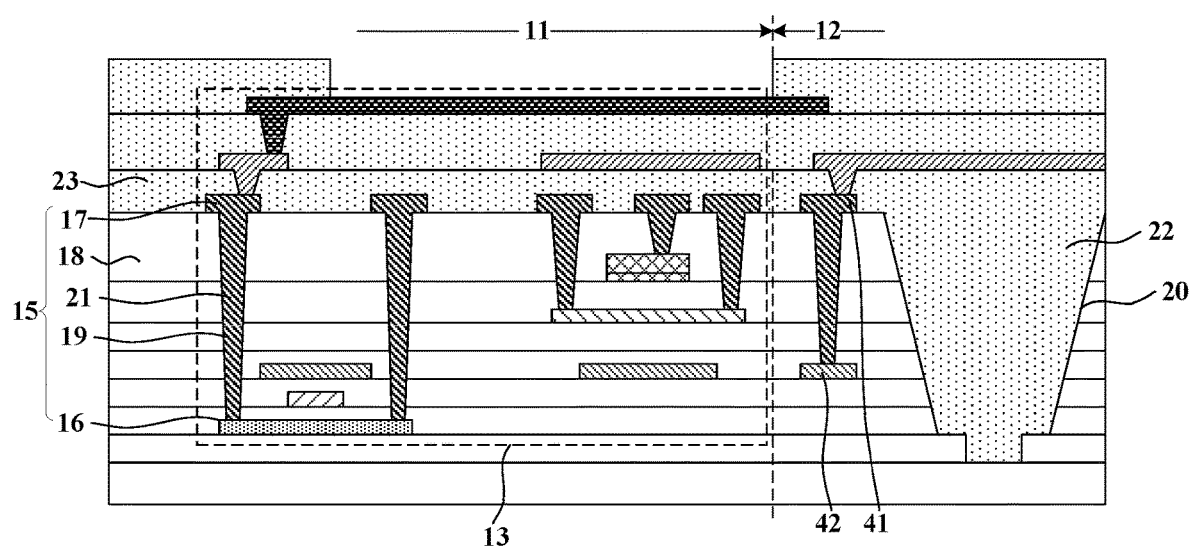
FIG. 2 is a cross-sectional diagram taken along A-A' in FIG. 1.

FIG. 1 is a schematic diagram of a display panel provided in an embodiment of the present disclosure; and FIG. 2 is a cross-sectional diagram taken along A-A' in FIG. 1. This embodiment may be applied to any type of display panel, such as an organic light-emitting display panel, and is not limited thereto. As shown in FIG. 1, the display panel includes a first region 11 and a second region 12, a first driver circuit 14, a first driver circuit 14, a function component 15, a function hole 19 and a virtual hole 20. The first region 11 includes a pixel unit 13. The first driver circuit 14 is located in the second region 12 and includes a first drive signal output terminal OUT, where the first drive signal output terminal OUT provides a first drive signal for the pixel unit 13 in the first region 11. The function component 15 includes a first function layer 16, a second function layer 17 and a preset dielectric layer 18 located between the first function layer 16 and the second function layer 17. The function hole 19 penetrates through the preset dielectric layer 18 and is configured to connect the first function layer 16 to the second function layer 17. The virtual hole 20 penetrates through the preset dielectric layer 18 and is not configured to connect the first function layer 16 to the second function layer 17, where at least one virtual hole 20 is located in the second region 12 and located on a side of the first drive signal output terminal OUT facing away from the first region 11.

In this embodiment, the display panel includes a first region 11 and a second region 12, the first region 11 includes a pixel unit 13, and the second region 12 includes a first driver circuit 14. The first driver circuit 14 disposed in the second region 12 is configured to drive the pixel unit 13 in the first region 11 to display, and specifically, the first driver circuit 14 provides a first drive signal for the pixel unit 13 through the first drive signal output terminal OUT. The first region 11 of the display panel is a display region of the display panel, and the second region 12 is a non-display region of the display panel; the pixel unit 13 in the display region may be an organic light-emitting display unit, a micro light-emitting diode display unit, or other types of pixel units, without specific limitation; the first driver circuit 14 in the non-display region may be a light-emitting control circuit, a gate driver circuit, and the like, but is not limited thereto. If the first driver circuit 14 is the light-emitting control circuit, then the first drive signal is a light-emitting control signal, and the first driver circuit 14 in the second region 12 provides the light-emitting control signal for the pixel unit 13 in the first region 11 through the first drive signal output terminal OUT to drive the pixel unit 13 to display; however, the first driver circuit is not limited to the light-emitting control circuit, and may also be another circuit structure for driving the pixel unit to operate, and a corresponding first drive signal changes.

As shown in FIG. 1, the first region 11 includes the pixel units 13 arranged in an array, and the arrangement of the pixel units 13 in the first region 11 may be other arrangements, not limited to an array arrangement. The first driver circuit 14 includes n first drive signal output terminals OUT which are sequentially marked as OUT(1)~OUT(n), n is a positive integer larger than or equal to 1, and one first drive signal output terminal OUT is correspondingly and electrically connected to one row or adjacent rows of pixel units 13 in the first region 11. For example, the OUT (1) is correspondingly and electrically connected to the pixel units 13 of a first row in the first region 11, and the first driver circuit 14 provides the first drive signal for each pixel unit 13 of the first row through the OUT (1); the OUT (n) is correspondingly and electrically connected to the pixel units 13 of a last row in the first region 11, and the first driver circuit 14 provides the first drive signal for each pixel unit 13 in the last row through the OUT (n). It should be appreciated that OUT in the first driver circuit 14 provides a signal to the pixel unit 13 in the first region 11, therefore the OUT in the first driver circuit 14 is oriented towards the first region 11, and the OUT is closer to the first region 11 than other devices or structures in the first driver circuit 14.

The display panel further includes a function component 15, and the function component 15 includes a first function layer 16, a second function layer 17 and a preset dielectric layer 18 located between the first function layer 16 and the second function layer 17. It should be appreciated that the function component 15 in the display panel plays a role in display, touch and other operation of the display panel, and the function component 15 is of a multi-film-layer stacked structure and specifically includes multiple function layers and dielectric layers located between adjacent function layers. The pixel unit 13 includes a function device such as a transistor, and the transistor functions for a display operation of the pixel unit 13. The transistor includes a source drain, a gate and an active layer, a source drain metal layer where the source drain is located is one function layer in the function component 15, a gate metal layer where the gate is located is another function layer in the function component 15, and an active film layer where the active layer is located is yet another function layer in the function component 15, an insulating layer formed between the source-drain and the gate is a dielectric layer in the function component 15, and the insulating layer formed between the gate and the active layer is another dielectric layer in the function component 15, but the function layer and the dielectric layer of the function component 15 are not limited to the above examples. The first driver circuit 14 includes a function device such as a transistor, the transistor plays a role in driving the first driver circuit 14, and each film layer of the transistor in the first driver circuit 14 also belongs to the function layer and the dielectric layer of the function component 15. In an embodiment, the source drain of the transistor in the pixel unit 13 and the source drain of the transistor in the first driver circuit 14 are located on a same source-drain metal layer, and the gate of the transistor in the pixel unit 13 and the gate of the transistor in the first driver circuit 14 are located on a same gate metal layer. The function component 15 forms multiple function devices and plays a role in the operation of the display panel.

The display panel further includes a function hole 19, the function hole 19 penetrates through the preset dielectric layer 18 and is used for connecting the first function layer 16 and the second function layer 17, the function hole 19 plays a signal transmission role between the first function layer 16 and the second function layer 17, and a signal of the first function layer 16 is transmitted to the second function layer 17 through the function hole 19, or a signal of the second function layer 17 is transmitted to the first function layer 16 through the function hole 19. As shown in FIG. 2, the transistor includes a source drain, a gate and an active layer, and the source drain and the active layer are connected through a via hole; the first function layer 16 is the active layer, the second function layer 17 is the source drain, the insulating layer between the source drain and the active layer is the preset dielectric layer 18, the via hole for connecting the source drain and the active layer is the function hole 19, and the function hole 19 penetrates through the preset dielectric layer 18 and is connected to the first function layer 16 and the second function layer 17. It should be appreciated that the first function layer 16, the second function layer 17 and the function hole 19 shown in FIG. 2 are only an example, in the present disclosure, the first function layer is not limited to the active layer, the second function layer is not limited to the source drain, and the first function layer and the second function layer may also be other function layers connected by the function hole in the display panel without being limited thereto; for example, the pixel unit includes a reference voltage end, the first function layer is a reference voltage line, the second function layer is the reference voltage end of the pixel unit, and the function hole is a via hole for connecting the reference voltage line and the reference voltage end. It should be noted that the function hole in the display panel is not limited to the via hole, but may also include other hole structures that plays a role in the operation of the display panel such as a groove, a notch.

The function hole 19 in the display panel is not only used for a signal transmission, but also may be used as a hydrogen relief channel of the active layer. After the function hole 19 is formed, the active layer is subjected to a hydrogen relief treatment, and then hydrogen in the active layer may be diverged through the function hole 19. Obviously, a number of function holes 19 in an area are the larger, the arrangement is the denser, and the hydrogen relief effect of the active layer in this area is the better.

The display panel further includes a virtual hole 20, the virtual hole 20 penetrates through the preset dielectric layer 18 and is not configured to connect the first function layer 16 to the second function layer 17, and the virtual hole 20 does not have a signal transmission function. As shown in FIG. 2, the virtual hole 20 penetrates through the preset dielectric layer 18, and the virtual hole 20 is not connected to the first function layer 16 or the second function layer 17, so that the virtual hole 20 cannot transmit a signal between the first function layer 16 and the second function layer 17. The virtual hole 20 in the display panel is completely different from the function hole 19, and the function hole 19 is connected to two function layers to transmit the signal and play a role in the operation of the display panel; however, the virtual hole 20 does not connect the two function layers and does not transmit a signal for the function layer, so that the virtual hole 20 does not play a role in the operation of the display panel. Based on this, a position of the virtual hole 20 is not specifically limited, the virtual hole 20 may be formed in the first region 11 of the display panel, the virtual hole 20 may also be formed in the second region 12 of the display panel, and the virtual hole 20 may be formed in any spare area of the display panel without affecting the operation of the display panel, for example, the virtual hole 20 is formed between adjacent function devices, or the virtual hole 20 may be formed near the function device, or the virtual hole 20 is formed inside the function device.

The virtual hole 20 formed in the display panel does not affect a display operation of the display panel, and may also be used as the hydrogen relief channel of the active layer, so that the hydrogen relief effect of the active layer in an area where the virtual hole 20 is located is improved, and thus the display effect of the display panel is improved. Both the first region 11 and the second region 12 in the display panel include a large number of transistors, the transistors include the active layer, the active layer contains hydrogen, if a content of hydrogen in the active layers is too high, the stability and reliability of the transistor may be affected, and thus the display effect is affected. The virtual hole 20 is formed in an area adjacent to the active layer of the transistor and may take a certain hydrogen relief effect, so that the content of the hydrogen in the active layer in the transistor may be reduced by performing the hydrogen relief treatment on the active layer after the virtual hole 20 is formed, and it should be noted that the virtual hole 20 is not filled during hydrogen relief, and the hydrogen in the active layer is convenient to diverge. Specifically, after the virtual hole 20 is formed, a film layer between the active layer of the transistor and the virtual hole 20 is thinned, and at this time, the hydrogen relief operation is performed, the hydrogen in the active layer may be dissociated into the virtual hole 20 and then diverged, the content of the hydrogen in the active layer is reduced, the stability and reliability of the transistor are improved, and thus the display effect is improved.

It should be noted that the stability of the transistor is affected due to the poor hydrogen relief effect of the active layer in the transistor, and a threshold voltage Vth is shifted after the transistor works for a long time. According to the present disclosure, the virtual hole is added to improve the hydrogen relief effect of the active layer in the transistor, whereby the stability of the transistor may be improved, a problem of threshold voltage offset of the transistor is solved, and the display effect of the display panel is improved.

At least one virtual hole 20 is located in the second region 12. The function holes 19 in the first region 11 are densely distributed and numerous, and the active layer is subjected to the hydrogen relief treatment through the function hole 19, so that the hydrogen relief effect of the active layer in the first region 11 is good. The relatively small number of function holes 19 in the second region 12 compared to the first region 11 makes the hydrogen relief effect of the second region 12 worse than the hydrogen relief effect of the first region 11. On the basis, at least one virtual hole 20 is formed in the second region 12, a number of hydrogen relief channels of the active layer in the second region 12 is increased, so that the hydrogen relief effect of the second region 12 may be improved, and a difference of the hydrogen relief effect between the first region 11 and the second region 12 is reduced.

At least one virtual hole 20 is located on a side of the first drive signal output terminal OUT facing away from the first region 11. The OUT in the first driver circuit 14 provides a signal for the pixel unit 13 in the first region 11, so that the OUT in the first driver circuit 14 is facing the first region 11, and correspondingly, a number of function holes 19 in an area facing the OUT in the first driver circuit 14 is large, and a number of function holes 19 in an area facing away from the OUT in the first driver circuit 14 is small, so that the hydrogen relief effect of the function hole in an area facing the first region 11 in the second region 12 is better than the hydrogen relief effect of the function hole in an area facing away from the first region 11 in the second region 12. Based on this, at least one virtual hole 20 is formed on a side of the first drive signal output terminal OUT facing away from the first region 11, and the hydrogen relief channel may be added to a side of the first drive signal output terminal OUT facing away from the first region 11, so that the hydrogen relief effect on a side of the second region 12 facing away from the first region 11 is improved, and a difference of the hydrogen relief effect between the side of the second region 12 facing the first region 11 and the side of the second region 12 facing away from the first region 11 is reduced.

Finally, the virtual hole 20 is formed, so that the hydrogen relief effects of the first region 11 and the second region 12 are made to be consistent as much as possible, and contents of hydrogen in the active layers of the first region 11 and the second region 12 are basically uniform, whereby the stability of the transistor may be improved, and thus the display effect is improved.

According to the present disclosure, the display panel includes the function hole and the virtual hole, and both the function hole and the virtual hole may be used as the hydrogen relief channel of the active layer; the function hole is connected to the first function layer and the second function layer in the function component, the function hole plays a signal transmission role between the first function layer and the second function layer; the virtual hole is not connected to the first function layer and the second function layer, and the virtual hole does not transmit a signal between the first function layer and the second function layer. The virtual hole is formed in the second region, so that the hydrogen relief channel of the active layer may be added to the second region, and a difference of the hydrogen relief effect of the active layer in the second region and the first region is reduced. At least one virtual hole is formed on the side of the second region facing away from the first region, so that the hydrogen relief difference of the active layers on the side of the second region facing the first region and on the side of the second region facing away from the first region may be balanced. Therefore, the hydrogen relief difference of active layers in the first region, on the side of the second region facing the first region, and on the side of the second region facing away from the first region is made as consistent as possible, whereby the stability and reliability of the transistor are improved, and further the display effect is improved.

In an embodiment, the virtual hole is not connected to the first function layer, and the virtual hole is not connected to the second function layer; or, the virtual hole is connected to the first function layer, and the virtual hole is not connected to the second function layer; or, the virtual hole is not connected to the first function layer, and the virtual hole is connected to the second function layer.

As shown in FIG. 2, the virtual hole 20 is not connected to the first function layer 16, and the virtual hole 20 is also not connected to the second function layer 17, and the virtual hole 20 penetrates through the preset dielectric layer 18. The virtual hole 20 does not have a signal transmission function, does not transmit a signal for the function layer, and does not affect a normal operation of the display panel. The virtual hole 20 is disposed in the display panel, so that the hydrogen relief effect of the active layer may be improved, the content of hydrogen of the active layer in the transistor can be reduced, the stability and reliability of the transistor are improved, and thus the display effect of the display panel is improved. A manufacturing process shown in FIG. 2 is as follows: the first function layer 16 and the second function layer 17 are respectively formed, and the preset dielectric layer 18 is disposed between the second function layer 17 and the first function layer 16; then the virtual hole 20 penetrating through the preset dielectric layer 18 is formed, and the virtual hole 20 is not in contact with the first function layer 16 and is not in contact with the second function layer 17; and then the dielectric layer is formed on the virtual hole 20, so that other film layer materials exist between the virtual hole 20 and the first function layer 16, and a dielectric layer material exists between the virtual hole 20 and the second function layer 17. In this way, the virtual hole 20 is not connected to the first function layer 16 and is not connected to the second function layer 17. It should be appreciated that the virtual hole 20 is positioned differently, and the manufacturing process of the virtual hole 20 is different, which is not limited to the above manufacturing steps.

Figure 3:
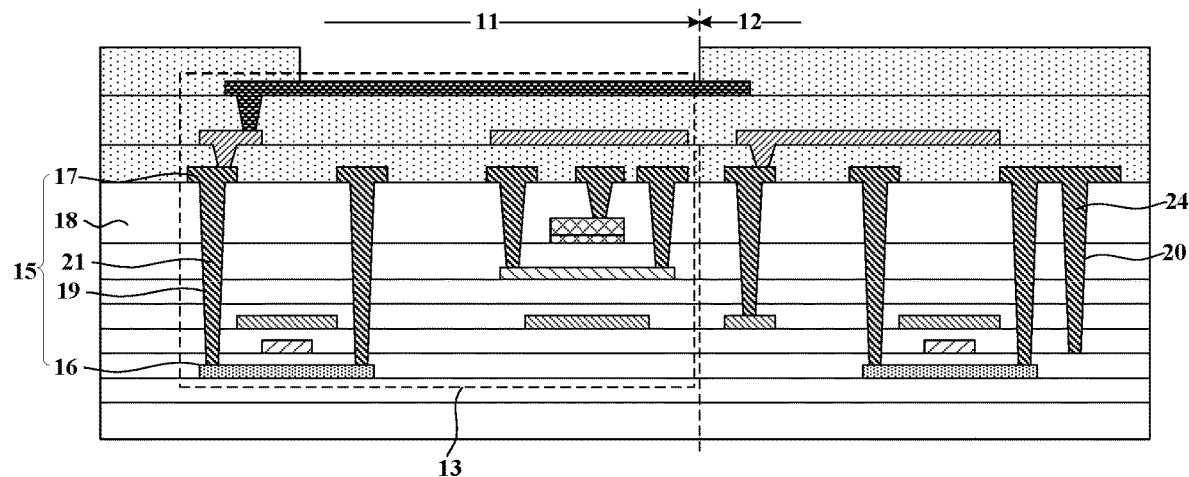
FIG. 3 is a schematic diagram of another display panel provided in an embodiment of the present disclosure.

FIG. 3 is a schematic diagram of another display panel provided in an embodiment of the present disclosure. As shown in FIG. 3, the virtual hole 20 is not connected to the first function layer 16, the virtual hole 20 is connected to the second function layer 17, and the virtual hole 20 penetrates through the preset dielectric layer 18. A manufacturing process shown in FIG. 3 is that: a first function layer 16 and a preset dielectric layer 18 are respectively formed; a virtual hole 20 penetrating through the preset dielectric layer 18 is formed, the virtual hole 20 is not in contact with the first function layer 16, and other film layer materials exist between the virtual hole 20 and the first function layer 16, the virtual hole 20 is not connected to the first function layer 16; and the second function layer 17 is formed on the virtual hole 20, the virtual hole 20 is filled with a material of the second function layer 17, and the virtual hole 20 is connected to the second function layer 17. In this way, the virtual hole 20 is not connected to the first function layer 16 and is connected to the second function layer 17. It should be appreciated that the virtual hole 20 is positioned differently, and the manufacturing process of the virtual hole 20 is different, which is not limited to the above manufacturing steps.

Figure 4:
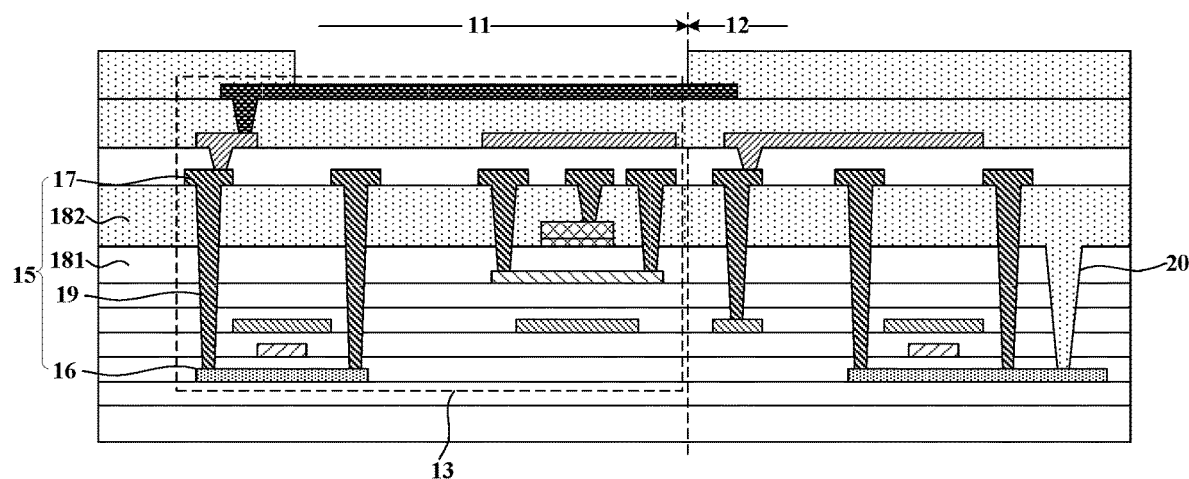
FIG. 4 is a schematic diagram of yet another display panel provided in an embodiment of the present disclosure.

FIG. 4 is a schematic diagram of yet another display panel provided in an embodiment of the present disclosure. As shown in FIG. 4, the virtual hole 20 is connected to the first function layer 16, the virtual hole 20 is not connected to the second function layer 17, and the virtual hole 20 penetrates through the first dielectric layer 181 which is a preset dielectric layer. A manufacturing process shown in FIG. 4 is that: a first function layer 16 and a first dielectric layer 181 are respectively formed; a virtual hole 20 penetrating through the first dielectric layer 181 is formed, the virtual hole 20 is in contact with the first function layer 16, no other film layer material exists between the virtual hole 20 and the first function layer 16, and the virtual hole 20 is connected to the first function layer 16; a second dielectric layer 182 is formed on the virtual hole 20, the virtual hole 20 is filled with a material of the second dielectric layer 182; and a second function layer 17 is formed on the second dielectric layer 182, a material of the second dielectric layer 182 exists between the virtual hole 20 and the second function layer 17, and the virtual hole 20 is not connected to the second function layer 17. In this way, the virtual hole 20 is connected to the first function layer 16 and not connected to the second function layer 17. It should be appreciated that the virtual hole 20 is positioned differently, and the manufacturing process of the virtual hole 20 is different, which is not limited to the above manufacturing steps.

It should be noted that after the function hole is formed, the active layer is subjected to the hydrogen relief treatment, so that hydrogen of the active layer is diverged through the function hole, and then the function hole is filled; and after the virtual hole is formed, the active layer is subjected to the hydrogen relief treatment, so that hydrogen of the active layer is dissociated into the virtual hole and diverged, and then the virtual hole is filled. If the virtual hole and the function hole are simultaneously manufactured by adopting one manufacturing procedure, then only a hydrogen relief procedure needs to be executed once; if the virtual hole and the function hole are manufactured in a time-division manner, and at least one film layer is arranged between the virtual hole and the function hole, then the hydrogen relief process needs to be executed once after the virtual hole is formed, and the hydrogen relief process needs to be executed once after the function hole is formed.

As described above, the virtual hole 20 does not connect the first function layer 16 and the second function layer 17, so the virtual hole 20 does not transmit a signal between the first function layer 16 and the second function layer 17 and does not affect a normal operation of the display panel. A number of hydrogen relief channels of the active layer may be increased by disposing the virtual hole 20 in the display panel, so that the hydrogen relief effect of the active layer may be improved, the content of hydrogen of the active layer in the transistor can be reduced, the stability and reliability of the transistor are improved, and thus the display effect of the display panel is improved.

In an embodiment, the function hole is filled with a first filling portion, and the virtual hole is filled with a second filling portion; where a material of the first filling portion is different from a material of the second filling portion. The function hole is connected to the first function layer and the second function layer and plays a signal transmission role between the first function layer and the second function layer, therefore the material of the first filling portion filled in the function hole is a conductive material to achieve the signal transmission role.

As shown in FIG. 2, after the first function layer 16, the preset dielectric layer 18 and the function hole 19 are formed, the function hole 19 extends to a surface of the first function layer 16, so that no other film layer material exists between the function hole 19 and the first function layer 16, and thus the function hole 19 is connected to the first function layer 16; the function hole 19 is filled with the first filling portion 21, and thus the first filling portion 21 is in direct contact with the first function layer 16; and the second function layer 17 covering the first filling portion 21 is formed, and thus the second function layer 17 is connected to the first function layer 16 through the first filling portion 21. In this way, the function hole 19 connects the first function layer 16 and the second function layer 17. It should be appreciated that the first filling portion 21 and the second function layer 17 may be manufactured by adopting two processes in a time-division manner, and the material of the first filling portion 21 may be the same as or different from the material of the second function layer 17.

With continued reference to FIG. 2, after the virtual hole 20 is formed, the virtual hole 20 is filled with the second filling portion 22, the second filling portion 22 is made of an insulating material, and a material of the first filling portion 21 is different from a material of the second filling portion 22. The virtual hole 20 is insulated from the first function layer 16 so that the virtual hole 20 is not connected to the first function layer 16, and the virtual hole 20 is insulated from the second function layer 17 so that the virtual hole 20 is not connected to the second function layer 17. In this way, the virtual hole 20 is not connected to the first function layer 16 and the second function layer 17.

In an embodiment, a material of the first filling portion is the same as a material of the first function layer or the second function layer; the display panel further includes a first film layer, and the first film layer is located on a side of the first function layer facing away from the second function layer, or the first film layer is located on a side of the second function layer facing from the first function layer, and the material of the second filling portion is the same as a material of the first film layer.

As shown in FIG. 2, the material of the first filling portion 21 is the same as the material of the second function layer 17, so that the first filling portion 21 and the second function layer 17 may be simultaneously formed by adopting one process, whereby the processes are reduced, and the cost is reduced. Specifically, after the function hole 19 is formed, the second function layer 17 is formed, the second function layer 17 covers the function hole 19 to fill the function hole 19 so as to form the first filling portion 21, the second function layer 17 is connected to the first function layer 16 through the first filling portion 21, and the material of the first filling portion 21 is the same as the material of the second function layer 17. In this way, the function hole 19 is connected to the first function layer 16 and the second function layer 17. It should be noted that the material of the first filling portion in the function hole may be the same as a material of the first function layer according to different manufacturing steps of the display panel, without a specific example.

With continued reference to FIG. 2, the display panel further includes a first film layer 23, and the first film layer 23 is located on a side of the second function layer 17 facing away from the first function layer 16. After the virtual hole 20 is formed, the second filling portion 22 is filled in the virtual hole 20, then the first film layer 23 covering the second filling portion 22 is formed, whereby the virtual hole 20 and the second function layer 17 are disposed in an insulating manner. It should be appreciated that the second filling portion 22 and the first film layer 23 may be made in two processes in a time-division manner, and the material of the second filling portion 22 may be the same as the material of the first film layer 23. The material of the second filling portion 22 and the material of the first film layer 23 are an insulating material. In other embodiments, the second filling portion 22 and the first film layer 23 may be simultaneously manufactured by adopting one process; specifically, after the virtual hole 20 is formed, the first film layer 23 is formed, the first film layer 23 covers the virtual hole 20 to fill the virtual hole 20 so as to form the second filling portion 22, and the first film layer 23 is the insulating layer so that the virtual hole 20 is not connected to the second function layer 17. It should be noted that according to different manufacturing steps of the display panel, the first film layer may also be located on a side of the first function layer facing away from the second function layer; or, the material of the second filling portion and the material of the first film layer may be different insulating materials.

In other embodiments, the first film layer is located on a side of the second function layer facing the first function layer; and the material of the second filling portion is the same as that of the first film layer. As shown in FIG. 4, the first film layer is a second dielectric layer 182, the second dielectric layer 182 is located on a side of the second function layer 17 facing the first function layer 16. In an embodiment, the second dielectric layer 182 and the second filling portion are formed simultaneously by adopting one process. Specifically, after the virtual hole 20 is formed, the second dielectric layer 182 is formed, and the second dielectric layer 182 covers the virtual hole 20 to form the second filling portion in the virtual hole 20; and the second function layer 17 is formed on the second dielectric layer 182, where the second function layer 17 is insulated from the virtual hole 20 through the second dielectric layer 182. In this way, the virtual hole 20 does not transmit a signal between the first function layer 16 and the second function layer 17.

It should be appreciated that the above is only a partial example of the virtual hole, and the virtual hole may also be formed at other different positions of the film layer without being limited to the above illustration, under the premise of ensuring that the virtual hole does not transmit the signal between the first function layer and the second function layer.

In an embodiment, the function hole is filled with a first filling portion, and the virtual hole is filled with a second filling portion; a material of the first filling portion is the same as a material of the second filling portion, the first filling portion is configured to transmit a signal in a display phase of the display panel, and the second filling portion is not configured to transmit a signal in the display phase of the display panel.

As shown in FIG. 3, after the first function layer 16, the preset dielectric layer 18 and the function hole 19 are formed, the function hole 19 extends to a surface of the first function layer 16, so that the function hole 19 is connected to the first function layer 16; the function hole 19 is filled with the first filling portion 21, the second function layer 17 covering the first filling portion 21 is formed, and thus the second function layer 17 is connected to the first function layer 16 through the first filling portion 21, and the first filling portion 21 is configured to transmit a signal. In this way, the function hole 19 is connected to the first function layer 16 and the second function layer 17. It should be appreciated that the material of the first filling portion 21 is a conductive material, and the first filling portion 21 and the second function layer 17 may be manufactured in two processes in a time-division manner or manufactured simultaneously in one process.

With continued reference to FIG. 3, after the virtual hole 20 is formed, the virtual hole 20 is filled with the second filling portion 24, the material of the second filling portion 24 is the same as the material of the first filling portion 21, that is, the material of the second filling portion 24 is a conductive material, and at least one dielectric layer is spaced between the second filling portion 24 and the first function layer 16, so that the virtual hole 20 is not connected to the first function layer 16; the second filling portion 24 is not used for transmitting a signal, and the second function layer 17 is formed on the second filling portion 24. It should be appreciated that, the material of the second filling portion 24 is a conductive material, and the second filling portion 24 and the second function layer 17 may be manufactured in two processes in a time-division manner or manufactured simultaneously in one process.

In an embodiment, the function hole 19 and the virtual hole 20 are manufactured by adopting a same process, the function hole 19 extends to the surface of the first function layer 16, the virtual hole 20 is not in contact with the first function layer 16, the function hole 19 is connected to the first function layer 16, and the virtual hole 20 is not connected to the first function layer 16; and correspondingly, the first filling portion 21, the second filling portion 24 and the second function layer 17 may be made simultaneously in one process, that is, the processes are reduced, the second function layer 17 covers the function hole 19 and the virtual hole 20 to form the first filling portion 21 and the second filling portion 24.

In other embodiments, at least one dielectric layer is disposed between the second filling portion and the first function layer so that the virtual hole is not connected to the first function layer, and/or at least one dielectric layer is disposed between the second filling portion and the second function layer so that the virtual hole is not connected to the second function layer, and the second filling portion is not used for transmitting a signal, which is not specifically exemplified.

In an embodiment, the display panel further includes a virtual function layer, the virtual function layer and the first function layer or the second function layer are located on a same layer, and in the display phase of the display panel, the virtual function layer is not used for transmitting a signal; and the virtual hole is connected to the virtual function layer.

Figure 5:
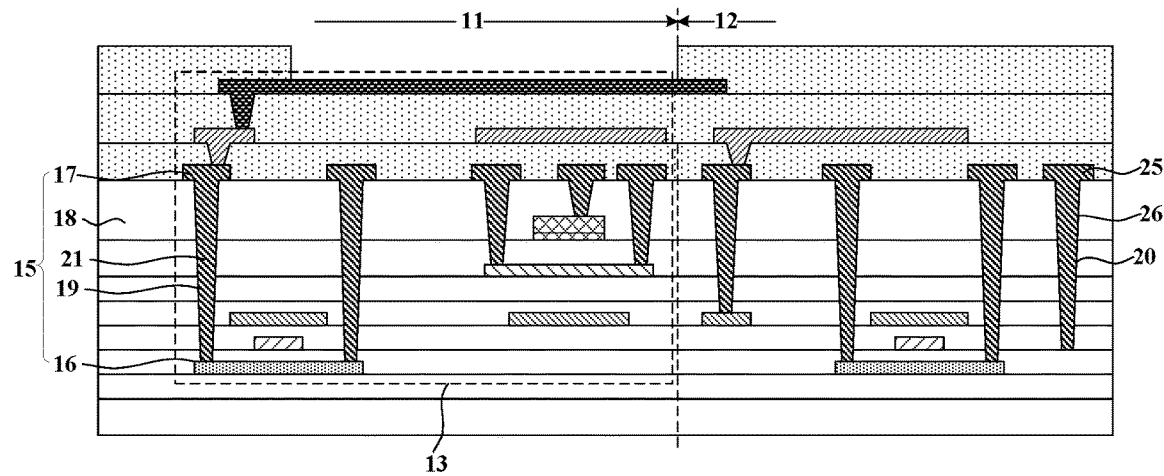
FIG. 5 is a schematic diagram of yet another display panel provided in an embodiment of the present disclosure.

FIG. 5 is a schematic diagram of yet another display panel provided in an embodiment of the present disclosure. As shown in FIG. 5, the display panel further includes a virtual function layer 25, the virtual function layer is located on a same layer as the second function layer 17, specifically, the virtual function layer 25 is not connected to the second function layer 17 and is not connected to any of other function layers, so that in the display phase of the display panel, the virtual function layer 25 does not function as the second function layer 17 and is not used for transmitting a signal, and a normal operation of the display panel is not affected. The virtual hole 20 is connected to the virtual function layer 25. In other embodiments, depending on the design of the display panel, the virtual function layer is located at a same layer as the first function layer, which is not specifically exemplified.

In an embodiment, the virtual hole 20 is filled with a second filling portion 26, and a material of the second filling portion 26 is the same as a material of the virtual function layer 25. Specifically, the second function layer 17, the second filling portion 26 and the virtual function layer 25 are manufactured by adopting a same process, after the virtual hole 20 is formed, the second function layer 17 and the virtual function layer 25 are formed simultaneously, and the virtual hole 20 is covered with the virtual function layer 25 so that the virtual hole 20 may be filled with the second filling portion 26. However, in other embodiments, the second function layer, the second filling portion and the virtual function layer may be manufactured by adopting different processes in a time-division manner, the material of the second filling portion may be the same as or different from the material of the virtual function layer, and the material of the second function layer may be the same as or different from the material of the virtual function layer.

In an embodiment, an aperture of the virtual hole is equal to or greater than an aperture of the function hole. The function holes are densely distributed in the display panel, and the function holes are connected to the first function layer and the second function layer, so that a large number of densely distributed function holes may perform a thorough hydrogen relief treatment on the active layer. Along with the requirement of a narrow frame, an area of the second region is smaller and smaller, a large number of virtual holes cannot be formed, a distribution density of the virtual holes is far smaller than that of the function holes, but an aperture of the virtual hole is the larger, the hydrogen of the active layer is more favorable to be diverged through the virtual hole, so that the hydrogen relief effect of the active layer may be improved. Based on this, in order to balance a hydrogen relief difference of the active layers in the first region and the second region, the aperture of the virtual hole may be increased. As shown in FIG. 2, the aperture of the virtual hole 20 is equal to or greater than an aperture of the function hole 19, so that the hydrogen relief effect of the active layer in the second region 12 may be improved, and the hydrogen relief difference of the active layers in the second region 12 and the first region 11 may be reduced.

In an embodiment, the display panel includes a preset transistor, the preset transistor includes an active layer, a gate, a source and/or a drain, the first function layer is the active layer, the second function layer is the source or the drain, and the preset dielectric layer is a film layer located between the active layer and the source or between the active layer and the drain. As shown in FIG. 2, a large number of transistors are designed in the display panel, the transistors in the first region 11 are mainly used for displaying, the transistors in the second region 12 are mainly used for driving the pixel unit 13 for displaying, the first function layer 16 is the active layer, the second function layer 17 is the source or the drain, and the first function layer 16 and the second function layer 17 are connected through the function hole 19, the preset dielectric layer 18 is a film layer located between the active layer and the source or between the active layer and the drain, exemplarily, the preset dielectric layer 18 is a dielectric layer located on a side of the source facing the active layer. In other embodiments, the first function layer is not limited to the active layer, and the second function layer is not limited to the source or the drain; or, the preset dielectric layer may be a gate insulating layer or other dielectric layer, which is not specifically exemplified herein. It should be appreciated that a transistor for performing another function, such as a transistor for performing a touch function, is also included in the display panel.

In an embodiment, the preset transistor includes a first transistor and a second transistor, the first transistor includes a first active layer, a first gate, a first source and/or a first drain, and the second transistor includes a second active layer, a second gate, a second source and/or a second drain; the first active layer includes silicon, and the second active layer includes an oxide semiconductor; where the first function layer is the first active layer, and the second function layer is the first source or the first drain; or the first function layer is the second active layer, and the second function layer is the second source or the second drain.

Figure 6:
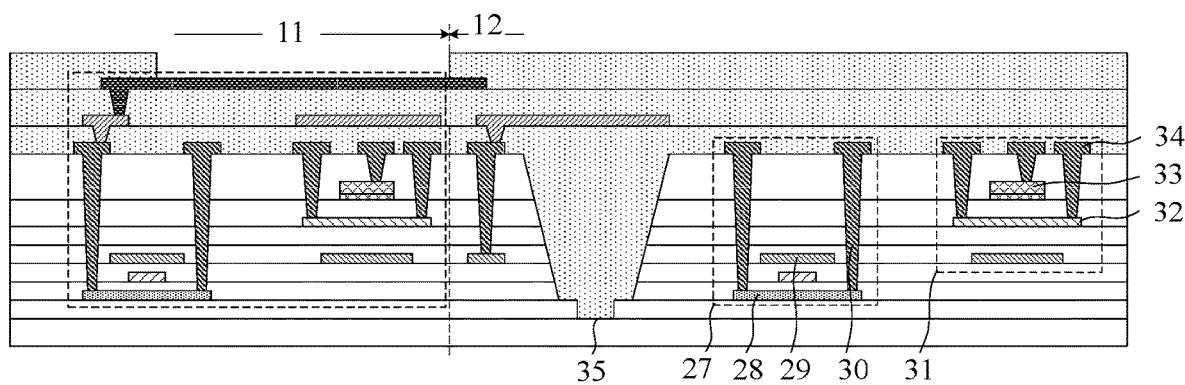
FIG. 6 is a schematic diagram of yet another display panel provided in an embodiment of the present disclosure.
Figure 7:
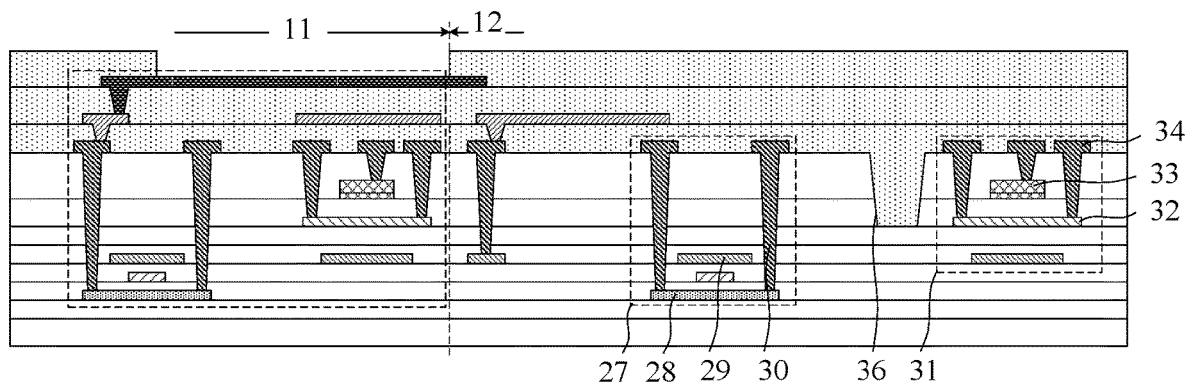
FIG. 7 is a schematic diagram of yet another display panel provided in an embodiment of the present disclosure.

FIG. 6 is a schematic diagram of yet another display panel provided in an embodiment of the present disclosure. As shown in FIG. 6, the first transistor 27 includes a first active layer 28 including silicon, a first gate 29, a first source and/or a first drain 30, and the first transistor 27 is a low temperature polysilicon transistor, but is not limited thereto. The second transistor 31 includes a second active layer 32, a second gate 33, a second source and/or a second drain 34, the second active layer 32 includes an oxide semiconductor, and the second transistor 31 is an indium gallium zinc oxide transistor, but is not limited thereto. In an embodiment, the first function layer is the first active layer 28, the second function layer is the first source or first drain 30, the virtual hole 35 is not connected to the first active layer 28 and the first source/drain 30, the virtual hole 35 is facing the first active layer 28, and then the hydrogen of the first active layer 28 in the first transistor 27 may be dissociated into the virtual hole 35 and diverged FIG. 7 is a schematic diagram of yet another display panel provided in an embodiment of the present disclosure. The difference from FIG. 6 is that, as shown in FIG. 7, the first function layer is the second active layer 32, the second function layer is the second source or second drain 34, the virtual hole 36 is not connected to the second active layer 32 and the second source/drain 34, the virtual hole 36 is facing the second active layer 32, and then the hydrogen of the second active layer 32 in the second transistor 31 may be dissociated into the virtual hole 36 and diverged.

In an embodiment, the function hole includes a first function hole and a second function hole, and the virtual holes include a first virtual hole and a second virtual hole; where the first function layer corresponding to the first function hole is the first active layer, the second function layer corresponding to the first function hole is the first source or the first drain, and the first function hole and the first virtual hole penetrate through a same preset dielectric layer; the first function layer corresponding to the second function hole is the second active layer, the second function layer corresponding to the second function hole is the second source or the second drain, and the second function hole and the second virtual hole penetrate through a same preset dielectric layer.

Figure 8:
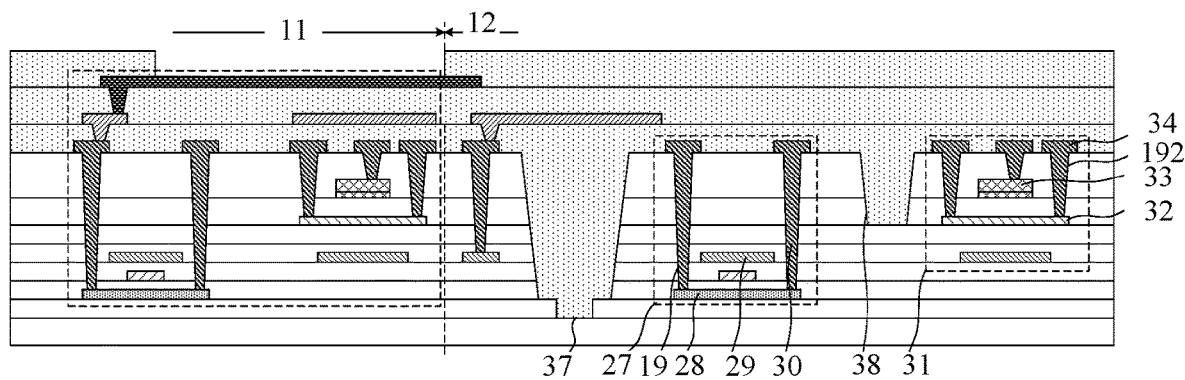
FIG. 8 is a schematic diagram of yet another display panel provided in an embodiment of the present disclosure.

FIG. 8 is a schematic diagram of yet another display panel provided in an embodiment of the present disclosure. As shown in FIG. 8, the function hole includes a first function hole 191, the first function layer corresponding to the first function hole 191 is the first active layer 28, and the second function layer corresponding to the first function hole 191 is the first source or first drain 30, that is, the first function hole 191 is connected to the first active layer 28 and the first source or first drain 30 in the first transistor 27. The virtual hole includes a first virtual hole 37, the first function hole 191 and the first virtual hole 37 penetrate through a same preset dielectric layer, the first virtual hole 37 is not connected to the first active layer 28 and the first source/drain 30, the first virtual hole 37 is facing the first active layer 28 of the first transistor 27, and hydrogen of the first active layer 28 in the first transistor 27 is dissociated into the first virtual hole 37 and diverged.

The function hole further includes a second function hole 192, the first function layer corresponding to the second function hole 192 is the second active layer 32, and the second function layer corresponding to the second function hole 192 is the second source or the second drain 34, that is, the second function hole 192 is connected to the second active layer 32 and the second source or the second drain 34 in the second transistor 31. The virtual hole further includes a second virtual hole 38, the second function hole 192 and the second virtual hole 38 penetrate a same preset dielectric layer, the second virtual hole 38 is not connected to the second active layer 32 and the second source or drain 34, the second virtual hole 38 is adjacent to the second active layer 32 of the second transistor 31, and hydrogen of the second active layer 32 in the second transistor 31 is dissociated into the second virtual hole 38 and is diverged.

As described above, the first transistor 27 and the second transistor 31 are respectively provided with corresponding virtual holes in the display panel, so that hydrogen in the first active layer 28 in the first transistor 27 may be diverged through the first virtual holes 37, and hydrogen in the second active layer 32 in the second transistor 31 may be diverged through the second virtual holes 38, thereby reducing the content of hydrogen in the active layer in the second region 12 and improving the hydrogen relief effect of the active layer. In addition, the first function hole 191 and the first virtual hole 37 penetrate through a same preset dielectric layer and may be manufactured by adopting a same process, so that the cost is reduced; the second function hole 192 and the second virtual hole 38 penetrate through a same preset dielectric layer and may be manufactured by adopting a same process, thereby reducing the cost.

Figure 9:
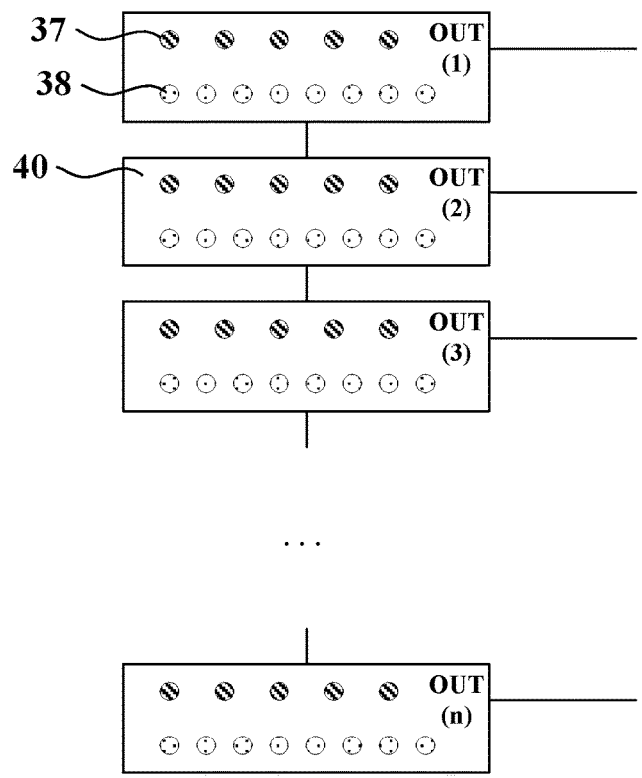
FIG. 9 is a schematic diagram of a first driver circuit provided in an embodiment of the present disclosure.

FIG. 9 is a schematic diagram of a first driver circuit provided in an embodiment of the present disclosure. As shown in FIG. 9, the first driver circuit includes multiple first shift registers 40 being cascaded with each other; where in an area corresponding to a first shift register 40 of the multiple first shift registers, and a number of first virtual holes 37 is less than a number of second virtual holes 38.

As shown in connection with FIGS. 8 and 9, the hydrogen of the first active layer 28 in the first transistor 27 is diverged through the first virtual hole 37, the first active layer 28 of the first transistor 27 includes silicon, the first transistor 27 being a low temperature polysilicon transistor. Hydrogen in the second active layer 32 of the second transistor 31 is diverged through the second virtual hole 38, the second active layer 32 of the second transistor 31 includes an oxide semiconductor, and the second transistor 31 is an indium gallium zinc oxide transistor. Since the oxide semiconductor-containing active layer is more sensitive to hydrogen, the stability of the second transistor 31 is poorer than that of the first transistor 27 when the active layer has the same content of hydrogen, and thus the active layer containing the oxide semiconductor has a higher requirement for hydrogen relief. Based on this, a number of the second virtual holes 38 is designed to be greater than a number of the first virtual holes 37, so that the hydrogen relief effect of the second active layer 32 containing the oxide semiconductor may be improved through the larger number of second virtual holes 38, the hydrogen relief is more thorough, and in this way, a hydrogen relief difference between the first active layer 28 and the second active layer 32 may be balanced.

In other embodiments, a number of first virtual holes is greater than or equal to a number of second virtual holes. The reason is that a number of low-temperature polycrystalline silicon transistors in some display panels is greater than a number of indium gallium zinc oxide transistors, the number and area of first active layers in the display panels are larger than those of second active layers, and therefore the requirement of the first transistors, i.e., the low-temperature polycrystalline silicon transistors, for hydrogen relief of the first active layers is larger; a larger number of the first virtual holes are designed, the hydrogen relief effect of the first active layer with a larger area may be improved, so that the hydrogen relief difference between the first active layer and the second active layer may be balanced.

In an embodiment, the display panel includes a preset transistor and a first connection-electrode. The preset transistor includes an active layer, a gate, a source and/or a drain. The first function layer is the first connection-electrode, the second function layer is the gate, the preset dielectric layer is a film layer between the first connection-electrode and the gate, and the first connection-electrode is configured to provide a signal for the gate or receive a signal from the gate.

A large number of transistors exist in the display panel, and gates of part of the transistors usually need to be electrically connected to one or more other nodes. For example, a gate of a drive transistor in a pixel unit may be connected to a reset transistor, and the gate of the drive transistor may also be connected to a capacitor. If a wire of the node and the gate of the transistor are located on a same layer, then a wire of a film layer where the gate of the transistor is located is dense, signal lines are prone to interference and the like, and the display is affected. Based on this, the wire of the node and the gate of the transistor are designed to be located at different layers, the wire of the node and the gate of the transistor are connected through the first connection-electrode, and the wire of the node and the gate of the transistor are located at different layers, then a number of wires in the same function layer can be reduced, a problem of signal line interference caused by dense wires is solved, and the display effect is improved.

As shown in FIG. 2, the first function layer is the first connection-electrode 41, the second function layer is a gate 42, the preset dielectric layer is a film layer between the first connection-electrode 41 and the gate 42, and the first connection-electrode 41 is configured to provide a signal for the gate 42 or receive a signal from the gate 42. In an embodiment, the preset transistor includes a first transistor and a second transistor, the first transistor includes a first active layer, a first gate, a first source and/or a first drain, and the second transistor includes a second active layer, a second gate, a second source and/or a second drain; the first connection-electrode includes a first sub-connection-electrode and a second sub-connection-electrode; the first active layer includes silicon, and the second active layer includes an oxide semiconductor; where the first function layer is the first sub-connection-electrode, the second function layer is the first gate, and the first sub-connection-electrode is configured to provide a signal for the first gate or receive a signal from the first gate; or the first function layer is the second sub-connection-electrode, the second function layer is the second gate, and the second sub-connection-electrode is configured to provide a signal for the second gate or receive a signal from the second gate.

Figure 10:
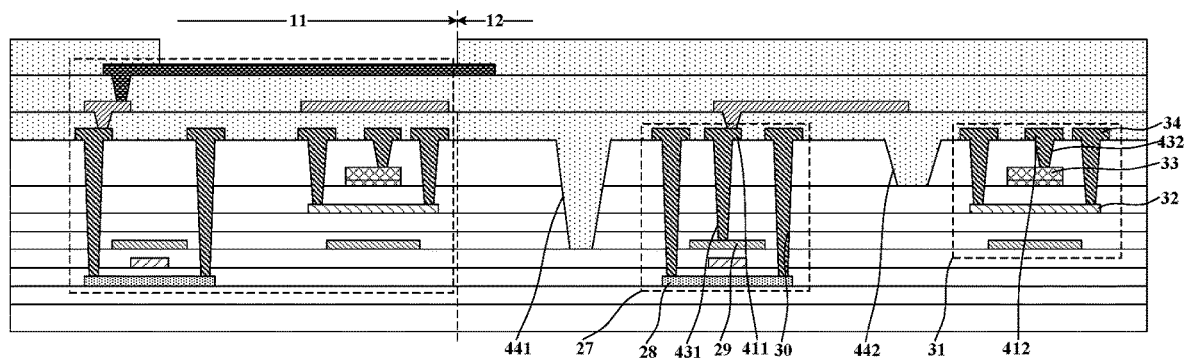
FIG. 10 is a schematic diagram of yet another display panel provided in an embodiment of the present disclosure.

FIG. 10 is a schematic diagram of yet another display panel provided in an embodiment of the present disclosure. As shown in FIG. 10, the preset transistor includes a first transistor 27 and a second transistor 31, the first transistor 27 includes a first active layer 28, a first gate 29, a first source and/or a first drain 30, and the second transistor 31 includes a second active layer 32, a second gate 33, a second source and/or a second drain 34. In an embodiment, the first transistor 27 is a low-temperature polycrystalline silicon transistor (LTPS-TFT) with an active layer containing silicon, and the second transistor 31 is an indium gallium zinc oxide transistor (IGZO-TFT) with an active layer containing an oxide semiconductor.

The first connection-electrode includes a first sub-connection-electrode 411 and a second sub-connection-electrode 412. In the first transistor 27, the first function layer is the first sub-connection-electrode 411, and the second function layer is the first gate 29, the first sub-connection-electrode 411 and the first gate 29 are connected through the function hole 431, and the first sub-connection-electrode 411 inputs or outputs a signal to or from the first gate 29. In the second transistor 31, the first function layer is the second sub-connection-electrode 412, the second function layer is the second gate 33, the second sub-connection-electrode 412 and the second gate 33 are connected through the function hole 432, and the second sub-connection-electrode 412 inputs or outputs a signal for the second gate 33.

As shown in FIG. 10, the function hole includes a third function hole 431 and a fourth function hole 432, and the virtual hole includes a third virtual hole 441 and a fourth virtual hole 442. The first function layer corresponding to the third function hole 431 is the first sub-connection-electrode 411, the second function layer corresponding to the third function hole 431 is the first gate 29, and the third function hole 431 and the third virtual hole 441 penetrate through a same preset dielectric layer; and the first function layer corresponding to the fourth function hole 432 is the second sub-connection-electrode 412, the second function layer corresponding to the fourth function hole 432 is the second gate 33, and the fourth function hole 432 and the fourth virtual hole 442 penetrate through a same preset dielectric layer.

For the first transistor 27, the third function hole 431 and the third virtual hole 441 penetrate through a same preset dielectric layer and may be manufactured by adopting a same process, so that the cost is reduced. The third virtual hole 441 is not connected to the first sub-connection-electrode 411 and the first gate 29, the third virtual hole 441 is facing the first active layer 28 of the first transistor 27, and hydrogen of the first active layer 28 in the first transistor 27 may be dissociated into the third virtual hole 441 and diverged.

For the second transistor 31, the fourth function hole 432 and the fourth virtual hole 442 penetrate through a same preset dielectric layer and may be manufactured by adopting a same process, so that the cost is reduced. If the fourth virtual hole 442 is not connected to the second sub-connection-electrode 412 and the second gate 33, the fourth virtual hole 442 is facing the second active layer 32 of the second transistor 31, and hydrogen of the second active layer 32 in the second transistor 31 may be dissociated into the fourth virtual hole 442 and diverged.

As described above, the first transistor 27 and the second transistor 31 are respectively provided with a corresponding virtual hole in the display panel, so that a distance from the active layer to the hole may be reduced, and hydrogen of the active layer may be favorably dissociated into the hole and be diverged. Based on this, the hydrogen of the first active layer 28 in the first transistor 27 may be made to be dissociated into the third virtual hole 441 and diverged; and the hydrogen of the second active layer 32 in the second transistor 31 may be dissociated into the fourth virtual hole 442 and be diverged, whereby a content of hydrogen of the active layer in the second region 12 is reduced, and thus the hydrogen relief effect of the active layer is improved.

Figure 11:
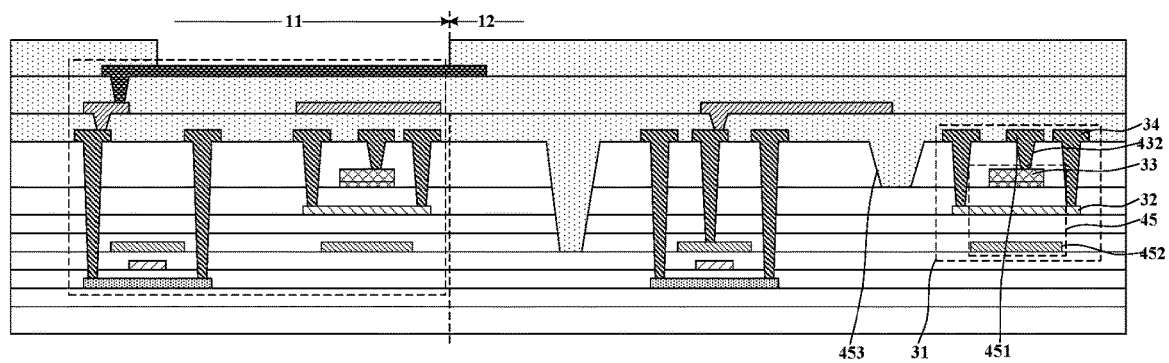
FIG. 11 is a schematic diagram of yet another display panel provided in an embodiment of the present disclosure.

In an embodiment, the display panel includes a preset capacitor and a second connection-electrode, the preset capacitor includes a first pole plate and a second pole plate, and the second connection-electrode is connected to the first pole plate or the second pole plate and is configured to provide a signal for the preset capacitor or receive a signal from the preset capacitor; where the first function layer is the second connection-electrode, and the second function layer is the first pole plate or the second pole plate. FIG. 11 is a schematic diagram of yet another display panel provided in an embodiment of the present disclosure. As shown in FIG. 11, the preset capacitor 45 includes a first pole plate 452 and a second pole plate 33, the second connection-electrode 451 is connected to the second pole plate 33, the first function layer is the second connection-electrode 451, and the second function layer is the second pole plate 33. In other embodiments, the second connection-electrode is connected to the first pole plate, the first function layer is the second connection-electrode, and the second function layer is the first pole plate.

The function hole 432 connects the second connection-electrode 451 and the second pole plate 33. In an embodiment, the virtual hole 453 and the function hole 432 penetrate through a same preset dielectric layer, and may be manufactured by adopting a same process, so that the cost is reduced. The virtual hole 453 is formed in the display panel, so that the distance from the active layer to the hole may be reduced, and hydrogen of the active layer may be favorably dissociated into the hole and be diverged, the content of hydrogen of the active layer in the second region 12 is reduced, and thus the hydrogen relief effect of the active layer is improved.

In an embodiment, the first driver circuit includes a first area facing the first region and a second area facing away from the first region, and the first drive signal output terminal is located in the first area. A density of virtual holes in the second area is greater than a density of virtual holes in the first area; and/or an aperture of the virtual hole in the second area is greater than an aperture of the virtual hole in the first area. In an embodiment, the display panel further includes a third region, where the third region is located on a side of the second region facing away from the first region; and where the third region includes the virtual hole.

Figure 12:
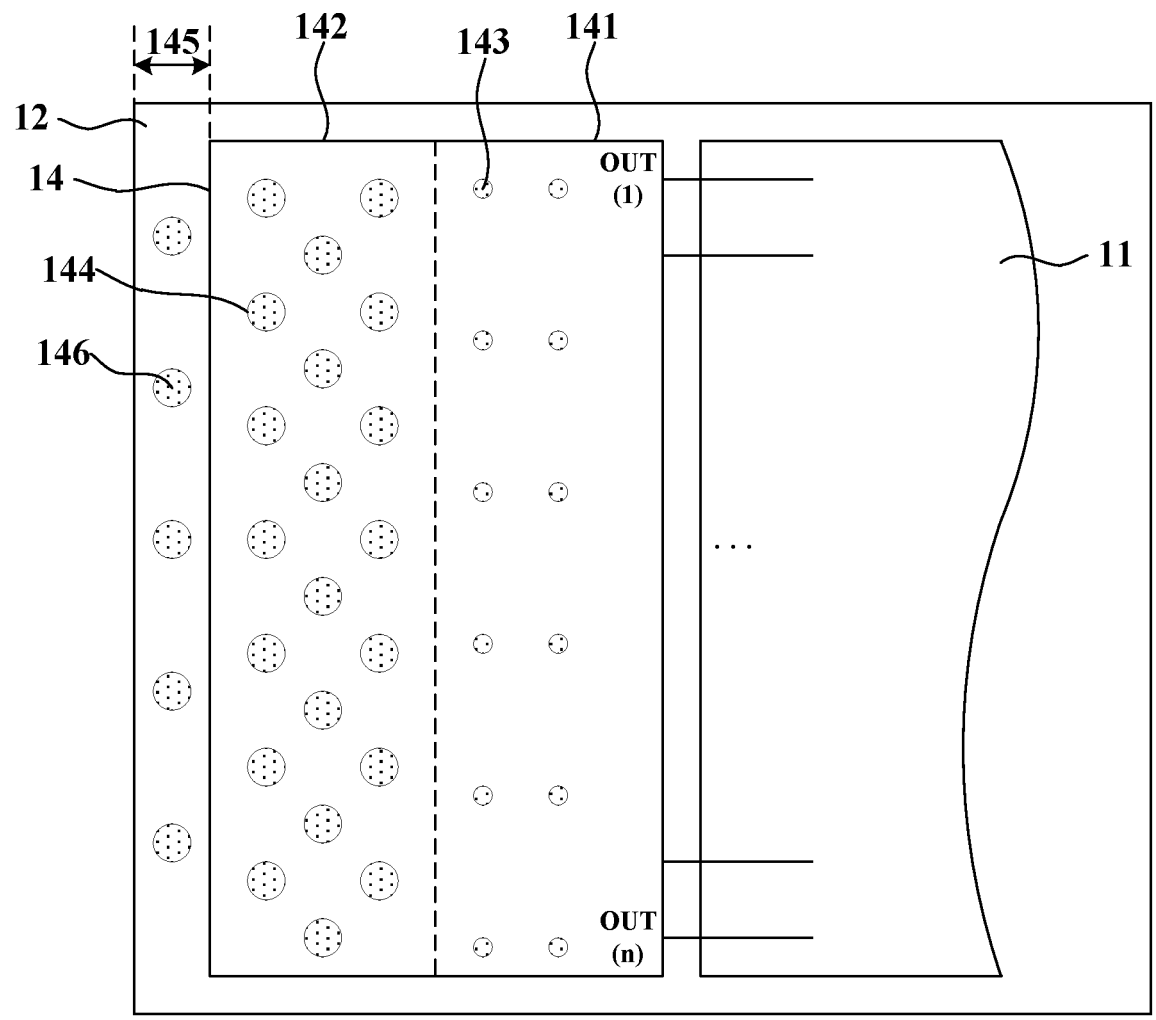
FIG. 12 is a schematic diagram of yet another display panel provided in an embodiment of the present disclosure.

FIG. 12 is a schematic diagram of yet another display panel provided in an embodiment of the present disclosure. As shown in FIG. 12, the first driver circuit 14 is divided into two areas, i.e., a first area 141 and a second area 142, the first area 141 is facing the first region 11, the second area 142 is facing away from the first region 11, the first drive signal output terminal OUT is facing the first region 11, and the first drive signal output terminal OUT is located in the first area 141. In the layout design of the display panel, in a direction from the first area 141 to the second area 142, a number of the transistors is gradually reduced, and correspondingly, a number of the function holes is gradually reduced, so that the hydrogen relief effect of the active layer in the second area 142 is weaker than that of the active layer in the first area 141, and the hydrogen relief requirement of the active layer in the second area 142 is larger.

Based on this, the density of the virtual holes 144 in the second area 142 may be designed to be larger than the density of the virtual holes 143 in the first area 141, in this way, the hydrogen relief effect of the active layer in the second area 142 is improved, a difference of the hydrogen relief effect of the active layers in the second area 142 and the first area 141 is balanced, so that the hydrogen relief effect of the active layer of the display panel is consistent as much as possible. Or, the aperture of the virtual hole 144 in the second area 142 may be designed to be larger than the aperture of the virtual hole 143 in the first area 141, in this way, the hydrogen relief effect of the active layer in the second area 142 is improved, the difference of the hydrogen relief effect of the active layers in the second area 142 and the first area 141 is balanced, so that the hydrogen relief effect of the active layer of the display panel is consistent as much as possible. Or, the aperture and density of the virtual holes 144 in the second area 142 may be designed to be greater than those of the virtual holes 143 in the first area 141, in this way, the hydrogen relief effect of the active layer in the second area 142 is improved, the difference of the hydrogen relief effect of the active layers in the second area 142 and the first area 141 is balanced, so that the hydrogen relief effect of the active layer of the display panel is consistent as much as possible.

As shown in FIG. 12, the optional display panel further includes a third region 145. The third region 145 is located on a side of the second region 12 facing away from the first region 11, the third region 145 is a bezel area in the second region 12 outside of the first driver circuit 14. The virtual hole 146 is formed in the third region 145, so that the hydrogen relief effect of the active layer of the second region 12 may be further improved, the difference of the hydrogen relief effect of the active layers in the second region 12 and the first region 11 is balanced, so that the hydrogen relief effect of the active layer of the display panel is consistent as much as possible.

In an embodiment, the first driver circuit includes multiple first shift registers being cascaded with each other, the first shift register includes a third transistor and a fourth transistor, and an area of an active layer of the third transistor is greater than an area of an active layer of the fourth transistor. A number of virtual holes with a distance between the virtual holes and the active layer of the third transistor being less than $R_0$ is $N_1$, and a number of virtual holes with a distance between the virtual holes and the active layer of the fourth transistor being less than $R_0$ is $N_2$, where $N_1 > N_2$. A distance between the active layer of the third transistor and the active layer of the fourth transistor is $D_0$, where $R_0 \leq D_0$.

Figure 13:
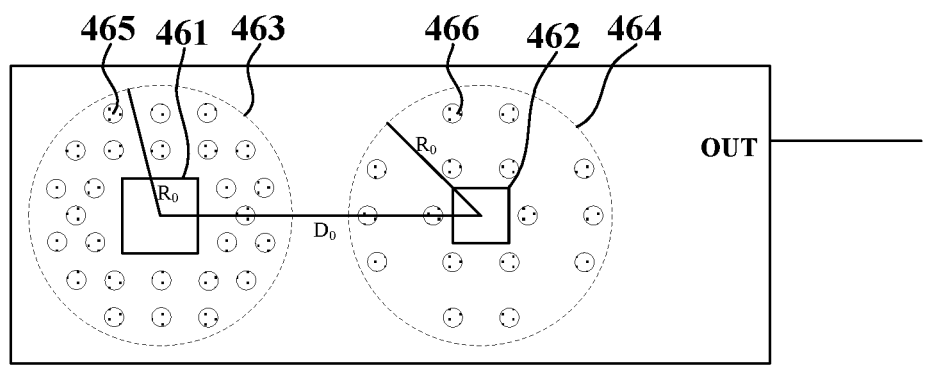
FIG. 13 is a partial schematic diagram of a first shift register provided in an embodiment of the present disclosure.

FIG. 13 is a partial schematic diagram of a first shift register provided in an embodiment of the present disclosure. As shown in FIG. 13, the first shift register includes a third transistor and a fourth transistor, and an area of an active layer 461 of the third transistor is greater than an area of an active layer 462 of the fourth transistor. A virtual circle 463 having a radius of $R_0$ is formed centered on the active layer 461, a virtual circle 464 having a radius of $R_0$ is formed centered on the active layer 462, a center distance between the virtual circle 463 and the virtual circle 464 is $D_0$, and $R_0 \leq D_0$. Within the virtual circle 463, a number of virtual holes 465 is $N_1$, within the virtual circle 464, a number of virtual holes 466 is $N_2$, and $N_1 > N_2$.

It should be appreciated that the area of the active layer 461 of the third transistor is greater than the area of the active layer 462 of the fourth transistor, therefore the hydrogen relief requirement of the active layer 461 of the third transistor is greater than the hydrogen relief requirement of the active layer 462 of the fourth transistor. The number of the virtual holes 465 near the active layer 461 of the third transistor may be increased and is greater than that of the virtual holes 466 near the active layer 462 of the fourth transistor, so that the hydrogen relief difference of the active layers of the third transistor and the fourth transistor may be balanced, and the hydrogen relief effects of the active layers of each transistor in the first shift register are made to be consistent as much as possible.

In an embodiment, the first driver circuit includes multiple first shift registers being cascaded with each other in a first direction; the display panel includes a first dimension and a second dimension in a second direction, and a total width of active layers of transistors in the first shift register in the first dimension is greater than a total width of active layers of transistors in the first shift register in the second dimension, and the first direction is perpendicular to the second direction; and a number of virtual holes in the first dimension is greater than a number of virtual holes in the second dimension; or, an aperture of the virtual hole in the first dimension is greater than an aperture of the virtual hole in the second dimension.

Figure 14:
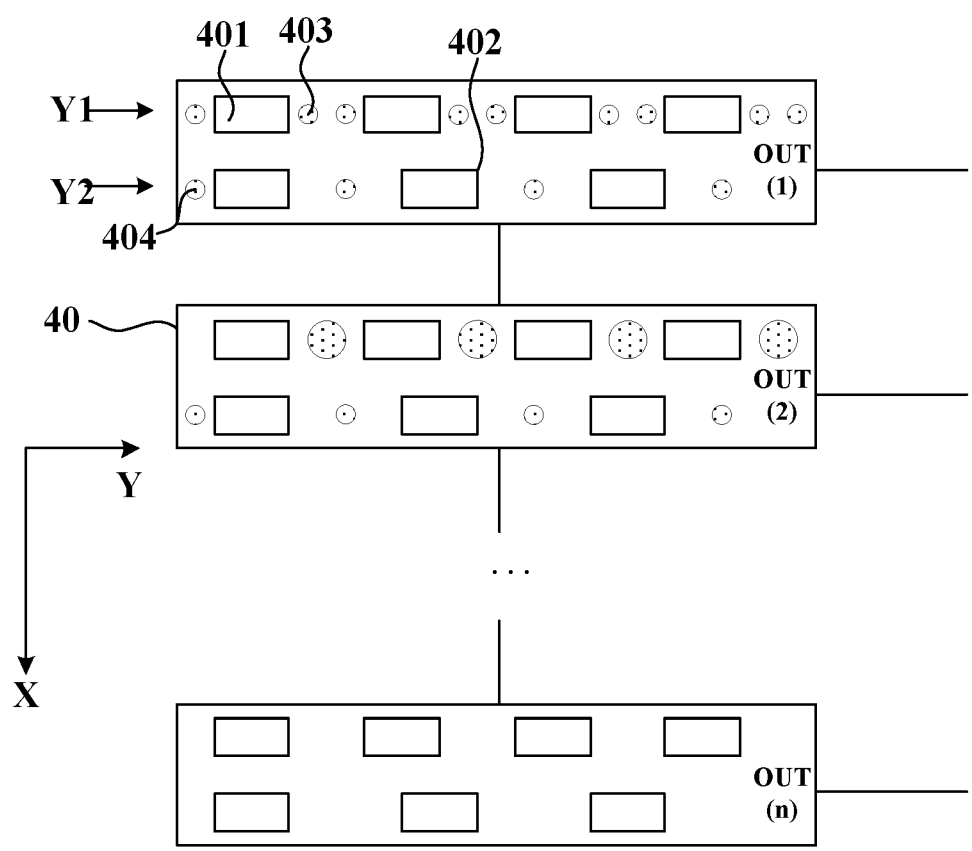
FIG. 14 is a schematic diagram of another first driver circuit provided in an embodiment of the present disclosure.

FIG. 14 is a schematic diagram of another first driver circuit provided in an embodiment of the present disclosure. As shown in FIG. 14, the first shift register 40 has a certain size in a first direction X in cascade and also has a certain size in a second direction Y perpendicular to the direction X in cascade. In the lateral second direction Y, the transistors in the first shift register 40 are laterally connected, and according to different layouts, the number of the transistors distributed in different lateral areas in the first shift register 40 may be different, so that widths of the active layers in the different lateral areas are different. Specifically, the first shift register 40 includes a first dimension Y1 and a second dimension Y2 in the second direction Y, one dimension corresponds to one lateral area. A total width of active layers 401 of transistors in the first shift register 40 in the first dimension Y1 is greater than a total width of active layers 402 of transistors in the first shift register 40 in the second dimension Y2, and then the hydrogen relief requirement of the active layer 401 in the first shift register 40 in the first dimension Y1 is greater than the hydrogen relief requirement in the second dimension Y2.

Based on this, the number of the virtual holes 403 in the first shift register 40 in the first dimension Y1 may be increased and is greater than the number of the virtual holes 404 in the first shift register 40 in the second dimension Y2, whereby the hydrogen relief effect of the active layers of different lateral areas in the first shift register 40 may be balanced, and the hydrogen relief effects of the active layers of different lateral areas in the first shift register 40 are made to be consistent as much as possible.

Or, the aperture of the virtual hole 403 in the first shift register 40 in the first dimension Y1 may be increased and is greater than the aperture of the virtual hole 404 in the first shift register 40 in the second dimension Y2, whereby the hydrogen relief effect of the active layers of different lateral areas in the first shift register 40 may be balanced, and the hydrogen relief effects of the active layers of different lateral areas in the first shift register 40 are made to be consistent as much as possible.

In an embodiment, the display panel further includes a second driver circuit. The second driver circuit is located in the second region and located on a side of the first driver circuit towards the first region. The first driver circuit includes multiple first shift registers being cascaded with each other, and the second driver circuit includes multiple second shift registers being cascaded with each other.

Figure 15:
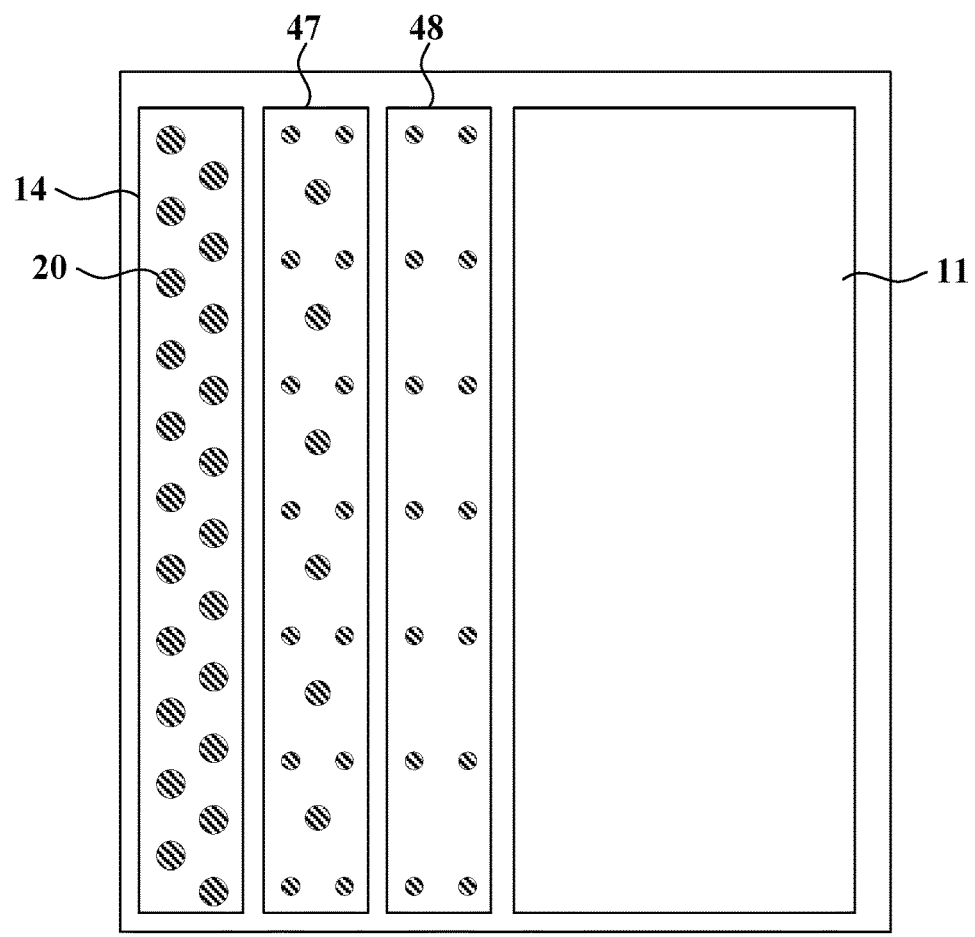
FIG. 15 is a schematic diagram of yet another display panel provided in an embodiment of the present disclosure.

FIG. 15 is a schematic diagram of yet another display panel provided in an embodiment of the present disclosure. As shown in FIG. 15, the display panel includes a first driver circuit 14 and a second driver circuit 47. The second driver circuit 47 is located in the second region 12 and is located on a side of the first driver circuit 14 facing the first region 11, that is, the second driver circuit 47 is facing the first region 11, and the first driver circuit 14 is facing away from the first region 11. The first driver circuit 14 includes multiple first shift registers being cascaded with each other, and the second driver circuit 47 includes multiple second shift registers being cascaded with each other. In an embodiment, the first driver circuit 14 is a light-emitting control circuit and is configured to provide a light-emitting control signal to the first region 11; the second driver circuit 47 is a scan driver circuit for supplying a scan drive signal (such as, a scan signal) to the first region 11.

As shown in FIG. 15, a number of virtual holes 20 included in an area corresponding to the first driver circuit 14 is $M_1$, and a number of virtual holes 20 included in an area corresponding to the second driver circuit 47 is $M_2$; and where $M_1 > M_2 \geq 0$.

The first driver circuit 14 is facing away from the first region 11, and the second driver circuit 47 is facing the first region 11. In the layout design of the display panel, a number of transistors in an area facing the first region 11 is large, and a number of transistors in an area facing away from the first region 11 is reduced. Accordingly, a number of function holes in the first driver circuit 14 facing away from the first region 11 is less than a number of function holes in the second driver circuit 47 facing the first region 11. Therefore, the hydrogen relief effect of the active layer in an area corresponding to the first driver circuit 14 is weaker than that in an area corresponding to the second driver circuit 47, and the hydrogen relief requirement of the active layer in the area corresponding to the first driver circuit 14 is larger.

Based on this, the number of the virtual holes 20 in the area corresponding to the first driver circuit 14 may be designed to be greater than the number of the virtual holes 20 in the area corresponding to the second driver circuit 47, in this way, the hydrogen relief effect of the active layer in the area corresponding to the first driver circuit 14 is improved, the difference of the hydrogen relief effect of the active layers of the first driver circuit 14 and the second driver circuit 47 is balanced, and the hydrogen relief effect of the active layer of the display panel is made to be consistent as much as possible.

In an embodiment, an aperture of at least one virtual hole 20 included in an area corresponding to the first driver circuit 14 is greater than an aperture of at least one virtual hole 20 included in an area corresponding to the second driver circuit 47. The hydrogen relief effect of the active layer in the area corresponding to the first driver circuit 14 may be further improved, and the difference of the hydrogen relief effect of the active layers of the first driver circuit 14 and the second driver circuit 47 is balanced, and the hydrogen relief effect of the active layers of the display panel is made to be consistent as much as possible.

In an embodiment, the display panel further includes a third driver circuit 48. The third driver circuit 48 is located in the second region 12 and located on a side of the second driver circuit 47 towards the first region 11. The third driver circuit 48 includes multiple third shift registers being cascaded with each other.

As shown in FIG. 15, the display panel further includes a third driver circuit 48, the third driver circuit 48 is closer to the first region 11 than the second driver circuit 47, the third driver circuit 48 includes multiple third shift registers being cascaded with each other. In an embodiment, the first driver circuit 14 is a light-emitting control circuit for providing a light-emitting control signal to the first region 11; the second driver circuit 47 is a first scan driver circuit for providing a first scan drive signal (such as, a scan-N signal) to the first region 11; the third driver circuit 48 is a second scan driver circuit for providing a second scan drive signal (such as, a scan-P signal) to the first region 11.

As shown in FIG. 15, a number of virtual holes 20 included in an area corresponding to the first driver circuit 14 is $M_1$, a number of virtual holes 20 included in an area corresponding to the second driver circuit 47 is $M_2$, and a number of virtual holes 20 included in an area corresponding to the third driver circuit 48 is $M_3$; and $M_1 > M_2 \geq M_3 \geq 0$.

The first driver circuit 14 is facing away from the first region 11, the second driver circuit 47 is facing the first region 11, and the third driver circuit 48 is closer to the first region 11 than the second driver circuit 47. In the layout design of the display panel, a number of transistors in the area facing the first region 11 is large, and a number of transistors in the area facing away from the first region 11 is reduced. Therefore, a number of function holes in the area corresponding to the first driver circuit 14 is less than a number of function holes in the area corresponding to the second driver circuit 47, and a number of function holes in the area corresponding to the second driver circuit 47 is less than a number of function holes in the area corresponding to the third driver circuit 48. Therefore, the hydrogen relief requirement of the active layer in the area corresponding to the first driver circuit 14 is greater than the active layer hydrogen relief requirement in the area corresponding to the second driver circuit 47, and the hydrogen relief requirement of the active layer in the area corresponding to the second driver circuit 47 is greater than the hydrogen relief requirement of the active layer in the area corresponding to the third driver circuit 48.

Based on this, the number of virtual holes 20 in the area corresponding to the first driver circuit 14 may be designed to be greater than the number of virtual holes 20 in the area corresponding to the second driver circuit 47, and/or that the number of virtual holes 20 in the area corresponding to the second driver circuit 47 is greater than the number of virtual holes 20 in the area corresponding to the third driver circuit 48, in this way, the difference of the hydrogen relief effect of the active layers of the first driver circuit 14, the second driver circuit 47 and the third driver circuit 48 is balanced, and the hydrogen relief effect of the active layer of the display panel is made to be consistent as much as possible.

In an embodiment, the first driver circuit 14, the second driver circuit 47 and the third driver circuit 48 satisfy at least one of the following conditions: 1) an aperture of at least one virtual hole 20 included in an area corresponding to the first driver circuit is larger than an aperture of at least one virtual hole 20 included in an area corresponding to the second driver circuit 47; 2) an aperture of at least one virtual hole 20 included in an area corresponding to the first driver circuit 14 is larger than an aperture of at least one virtual hole 20 included in an area corresponding to the third driver circuit 48; or 3) an aperture of at least one virtual hole 20 included in an area corresponding to the second driver circuit 47 is larger than an aperture of at least one virtual hole 20 included in an area corresponding to the third driver circuit 48.

As described above, an aperture of at least one virtual hole 20 included in an area corresponding to the first driver circuit is larger than an aperture of at least one virtual hole 20 included in an area corresponding to the second driver circuit 47; and/or an aperture of at least one virtual hole 20 included in an area corresponding to the second driver circuit 47 is larger than an aperture of at least one virtual hole 20 included in an area corresponding to the third driver circuit 48. In this way, the difference of the hydrogen relief effect of the active layers of the first driver circuit 14, the second driver circuit 47 and the third driver circuit 48 may be further balanced, and the hydrogen relief effect of the active layer of the display panel is made to be consistent as much as possible.

Figure 16:
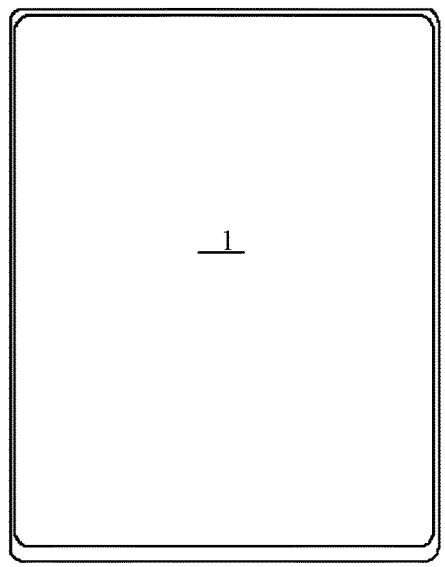
FIG. 16 is a schematic diagram of a display device provided in an embodiment of the present disclosure.

Based on a same inventive concept, an embodiment of the present disclosure further provides a display device including the display panel described above. The display panel is an organic light-emitting display panel or a micro LED display panel, but is not limited thereto. FIG. 16 is a schematic diagram of a display device provided in an embodiment of the present disclosure, as shown in FIG. 16, the display device is applied to an electronic device 1 such as a smart phone, a tablet computer. It should be appreciated that the above-described embodiments provide only some examples of the display panel, and that the display panel also includes other structures, which are not described herein in one-to-one manner. In the present disclosure, the virtual holes are added to balance the difference of the hydrogen relief effect of the active layers of the first region and the second region, the stability of the transistor is improved, a problem of threshold voltage offset of the transistor is solved, and the display effect of the display panel is improved.

It should be appreciated that various forms of the flows, the reordering step, the adding step or the deleting step shown above may be used. For example, as long as the desired result of the technical scheme provided in the present disclosure may be achieved, the steps described in the present disclosure may be executed in parallel, sequentially or in different orders, which is not limited herein.

The above-described specific implementations should not be construed as limiting the scope of protection of the present disclosure. It should be appreciated by those skilled in the art that various modifications, combinations, sub-combinations and substitutions may be made depending on design requirements and other factors. Any modification, equivalent replacement, and improvement made within the spirit and principle of the present disclosure should be included in the scope of protection of the present disclosure.

What is claimed is:

1. A display panel, comprising:
a first region and a second region, wherein the first region comprises a pixel unit;
a first driver circuit, wherein the first driver circuit is located in the second region and comprises a first drive signal output terminal, and the first drive signal output terminal is configured to provide a first drive signal for the pixel unit in the first region;
a function component, wherein the function component comprises a first function layer, a second function layer and a preset dielectric layer located between the first function layer and the second function layer;
a function hole, wherein the function hole penetrates through the preset dielectric layer and is configured to connect the first function layer to the second function layer; and
virtual holes, wherein a virtual hole of the virtual holes penetrates through the preset dielectric layer and is not configured to connect the first function layer to the second function layer, at least one virtual hole of the virtual holes is located in the second region and located on a side of the first drive signal output terminal facing away from the first region,
wherein the function hole is filled with a first filling portion, and the virtual hole is filled with a second filling portion; a material of the first filling portion is the same as a material of the second filling portion, the first filling portion is configured to transmit a signal in a display phase of the display panel, and the second filling portion is not configured to transmit a signal in the display phase of the display panel, or
wherein the display panel further comprises a virtual function layer, wherein the virtual function layer is located on a same layer as the first function layer or the second function layer, wherein the function hole is filled with a first filling portion, and the virtual hole is filled with a second filling portion; a material of the first filling portion is the same as a material of the second filling portion, the virtual function layer is not configured to transmit a signal in a display phase of the display panel; the virtual hole is connected to the virtual function layer, wherein the second filling portion is not configured to transmit a signal in the display panel of the display panel, and the first filling portion is configured to transmit a signal in the display phase of the display panel.

2. The display panel of claim 1, wherein the virtual hole is not connected to the first function layer, and the virtual hole is not connected to the second function layer;
the virtual hole is connected to the first function layer, and the virtual hole is not connected to the second function layer; or
the virtual hole is not connected to the first function layer, and the virtual hole is connected to the second function layer.

3. The display panel of claim 1, wherein the function hole is filled with a first filling portion, and the virtual hole is filled with a second filling portion; and
wherein a material of the first filling portion is different from a material of the second filling portion.

4. The display panel of claim 3, wherein the material of the first filling portion is the same as a material of the first function layer or a material of the second function layer;
the display panel further comprises a first film layer, wherein the first film layer is located on a side of the first function layer facing away from the second function layer, or the first film layer is located on a side of the second function layer facing away from the first function layer; and
the material of the second filling portion is the same as a material of the first film layer.

5. The display panel of claim 1, wherein the virtual hole is filled with a second filling portion, and a material of the second filling portion is the same as a material of the virtual function layer.

6. The display panel of claim 1, wherein an aperture of the virtual hole is equal to or greater than an aperture of the function hole.

7. The display panel of claim 1, comprising a preset transistor, wherein the preset transistor comprises at least one of an active layer, a gate, a source or a drain, wherein the first function layer is the active layer, the second function layer is the source or the drain, and the preset dielectric layer is a film layer located between the active layer and the source or between the active layer and the drain.

8. The display panel of claim 1, wherein the first driver circuit comprises a first area facing the first region and a second area facing away from the first region, and the first drive signal output terminal is located in the first area;
wherein the display panel comprises at least one of:
a density of virtual holes in the second area is greater than a density of virtual holes in the first area; or
an aperture of a virtual hole of the virtual holes in the second area is larger than an aperture of a virtual hole of the virtual holes in the first area.

9. The display panel of claim 8, wherein:
both the first area and the second area each has at least one virtual hole.

10. The display panel of claim 1, further comprising a third region, wherein the third region is located on a side of the second region facing away from the first region; and
wherein the third region comprises virtual holes.

11. The display panel of claim 1, wherein the first driver circuit comprises a plurality of first shift registers being cascaded with each other, each of the plurality of first shift registers comprises a third transistor and a fourth transistor, and an area of an active layer of the third transistor is larger than an area of an active layer of the fourth transistor;
wherein a number of virtual holes with a distance between the virtual holes and the active layer of the third transistor being less than $R_0$ is $N_1$, and a number of virtual holes with a distance between the virtual holes and the active layer of the fourth transistor being less than $R_0$ is $N_2$, wherein $N_1 > N_2$;
wherein a distance between the active layer of the third transistor and the active layer of the fourth transistor is $D_0$; and
wherein $R_0 \leq D_0$.

12. The display panel of claim 1, wherein the first driver circuit comprises a plurality of first shift registers being cascaded with each other in a first direction;
the display panel comprises a first dimension and a second dimension in a second direction, and a total width of active layers of transistors in the plurality of first shift registers in the first dimension is greater than a total width of active layers of transistors in the plurality of first shift registers in the second dimension, and the first direction is perpendicular to the second direction; and
wherein a number of virtual holes in the first dimension is greater than a number of virtual holes in the second dimension; or, an aperture of the virtual hole in the first dimension is larger than an aperture of the virtual hole in the second dimension.

13. The display panel of claim 1, further comprising a second driver circuit, wherein the second driver circuit is located in the second region and located on a side of the first driver circuit towards the first region; and
wherein the first driver circuit comprises a plurality of first shift registers being cascaded with each other, and the second driver circuit comprises a plurality of second shift registers being cascaded with each other.

14. The display panel of claim 13, wherein a number of virtual holes comprised in an area corresponding to the first driver circuit is $M_1$, and a number of virtual holes comprised in an area corresponding to the second driver circuit is $M_2$; and
wherein $M_1 > M_2 \geq 0$.

15. The display panel of claim 13, wherein an aperture of at least one virtual hole comprised in an area corresponding to the first driver circuit is larger than an aperture of at least one virtual hole comprised in an area corresponding to the second driver circuit.

16. The display panel of claim 13, further comprising a third driver circuit, wherein the third driver circuit is located in the second region and located on a side of the second driver circuit towards the first region;
wherein the third driver circuit comprises a plurality of third shift registers being cascaded with each other.

17. The display panel of claim 16, wherein a number of virtual holes comprised in an area corresponding to the first driver circuit is $M_1$, a number of virtual holes comprised in an area corresponding to the second driver circuit is $M_2$, and a number of virtual holes comprised in an area corresponding to the third driver circuit is $M_3$; and
wherein $M_1 > M_2 \geq M_3 \geq 0$.

18. The display panel of claim 17, wherein the first driver circuit, the second driver circuit and the third driver circuit satisfy at least one of:
an aperture of at least one virtual hole comprised in an area corresponding to the first driver circuit is larger than an aperture of at least one virtual hole comprised in an area corresponding to the second driver circuit;
an aperture of at least one virtual hole comprised in an area corresponding to the first driver circuit is larger than an aperture of at least one virtual hole comprised in an area corresponding to the third driver circuit; or
an aperture of at least one virtual hole comprised in an area corresponding to the second driver circuit is larger than an aperture of at least one virtual hole comprised in an area corresponding to the third driver circuit.

19. A display device, comprising a display panel, wherein the display panel comprises:
a first region and a second region, wherein the first region comprises a pixel unit;
a first driver circuit, wherein the first driver circuit is located in the second region and comprises a first drive signal output terminal, and the first drive signal output terminal is configured to provide a first drive signal for the pixel unit in the first region;
a function component, wherein the function component comprises a first function layer, a second function layer and a preset dielectric layer located between the first function layer and the second function layer;
a function hole, wherein the function hole penetrates through the preset dielectric layer and is configured to connect the first function layer to the second function layer; and
virtual holes, wherein a virtual hole of the virtual holes penetrates through the preset dielectric layer and is not configured to connect the first function layer to the second function layer, at least one virtual hole of the virtual holes is located in the second region and located on a side of the first drive signal output terminal facing away from the first region,
wherein the function hole is filled with a first filling portion, and the virtual hole is filled with a second filling portion; a material of the first filling portion is the same as a material of the second filling portion, the first filling portion is configured to transmit a signal in a display phase of the display panel, and the second filling portion is not configured to transmit a signal in the display phase of the display panel, or
wherein the display panel further comprises a virtual function layer, wherein the virtual function layer is located on a same layer as the first function layer or the second function layer, wherein the function hole is filled with a first filling portion, and the virtual hole is filled with a second filling portion; a material of the first filling portion is the same as a material of the second filling portion, the virtual function layer is not configured to transmit a signal in a display phase of the display panel; the virtual hole is connected to the virtual function layer, wherein the second filling portion is not configured to transmit a signal in the display panel of the display panel, and the first filling portion is configured to transmit a signal in the display phase of the display panel.

* * * * *